United States Patent [19]

Lee et al.

[11] Patent Number: 5,395,787

[45] Date of Patent: Mar. 7, 1995

[54] METHOD OF MANUFACTURING SHALLOW JUNCTION FIELD EFFECT TRANSISTOR

[75] Inventors: Kuo-Hua Lee; Chun-Ting Liu, both of Wescosville, Pa.; Ruichen Liu, Warren, N.J.

[73] Assignee: AT&T Corp., Murray Hill, N.J.

[21] Appl. No.: 160,701

[22] Filed: Dec. 1, 1993

[51] Int. Cl.6 .......................................... H01L 21/265
[52] U.S. Cl. ................................... 437/57; 437/160; 437/162; 437/29; 437/200; 437/41; 437/34
[58] Field of Search ................... 437/29, 41, 162, 160, 437/154, 141, 200, 950, 57, 34; 148/DIG. 144

[56] References Cited

U.S. PATENT DOCUMENTS

| | | | |
|---|---|---|---|
| 4,844,776 | 7/1989 | Lee et al. | 156/653 |
| 4,922,311 | 5/1990 | Lee et al. | 357/23.1 |
| 5,268,317 | 12/1993 | Schwalke et al. | 437/41 |
| 5,279,976 | 1/1994 | Hayden | 437/31 |
| 5,281,552 | 1/1994 | King et al. | 437/131 |

FOREIGN PATENT DOCUMENTS 4-038834  2/1992  Japan .

OTHER PUBLICATIONS

Wolf, S. "Silicon Processing for the VLSI Era", Lattice Press, Sunset Beach, CA. (1990).

Primary Examiner—George Fourson
Assistant Examiner—David M. Mason
Attorney, Agent, or Firm—Richard D. Laumann

[57] ABSTRACT

Shallow junctions n- and p-channel field effect transistors are formed with a single ion implant into a conformal tungsten silicide layer. Although phosphorous and boron are implanted into the same silicide regions, the phosphorous prevents the boron from outdiffusing.

6 Claims, 1 Drawing Sheet

METHOD OF MANUFACTURING SHALLOW JUNCTION FIELD EFFECT TRANSISTOR

TECHNICAL FIELD

This invention relates generally to the field of field effect transistors and particularly to such transistors formed by dopant diffusion from a silicide layer.

BACKGROUND OF THE INVENTION

As integrated circuits have become more complex, the individual devices, such as field effect transistors, forming the integrated circuits have become smaller and more closely spaced to each other. Simple shrinkage of device dimensions was not sufficient to permit the increased complexity of the new circuits; new processing technologies and innovative devices were also required.

An example will illustrate the point. The source and drain regions of the field effect transistor must be separately electrically contacted. This is frequently done by depositing a dielectric layer over the transistor, patterning the dielectric layer to form windows which expose portions of the source/drain regions, and then depositing metal in the windows. A typical metal is aluminum. However, aluminum tends to diffuse or spike into the silicon substrate. Such diffusion is undesirable. Diffusion barrier layers are deposited to prevent such spiking. Deposition of the barrier layer material into windows frequently results in poor coverage near the bottoms of the windows. Of course, the dielectric windows must be accurately positioned with respect to the source/drain regions.

An innovative design which decreases the alignment accuracy required for the dielectric windows is described in U.S. Pat. Nos. 4,844,776 and 4,922,311 issued to K. -H. Lee, C. -Y. Lu and D Yaney. These patents describe both a device and a method for making the device which is termed a folded extended window field effect transistor and is commonly referred to by the acronym FEWMOS. In an exemplary embodiment, a layer of a conducting material, such as TiN, is blanket deposited after transistor elements, including an insulating layer on top of the gate electrode, are formed. The conducting layer is patterned to form window or landing pads which cover at least portions of the source/drain regions. The window pads may be larger than the source/drain regions provided that they do not contact each other on top of the gate electrode; they may also extend onto the field oxide regions adjacent the source/drain regions. The window pads act as etch stop layers when the windows in the dielectric are etched thereby preventing etching into the source/drain regions.

Dopants must be put into the substrate to form the source/drain regions. This is frequently done by ion implantation. There are many device characteristics that are enhanced by forming shallow junctions; that is, very shallow source/drain regions. Shallow regions may be difficult to fabricate with ion implantation while at the same time maintaining a smooth surface to avoid junction interface roughness. In one embodiment, FEWMOS teaches the use of a polycide as the window pad layer material. The source/drain regions are formed by a thermal drive out from ion implanted polysilicon. A metal is deposited and a salicide formed. However, salicided polysilicon may lead to junction roughness. Additionally, separate implants are required for the n- and p-channel transistors.

SUMMARY OF THE INVENTION

According to an exemplary embodiment of this invention, an integrated circuit having both n- and p-channel field effect transistors is fabricated by forming regions of first and second conductivity types in a substrate, and fabricating gate structures of at least first and at least second field effect transistors. At least one field effect transistors is in each region of first and second conductivity types. A dopant implant layer is formed and a blanket implant of a first dopant having a first conductivity type is performed. The surface is masked to cover the regions of said second conductivity type, and a second dopant having a second conductivity type is blanket implanted. The structure is then heated to cause the dopants to diffuse from the dopant implant layer and form source/drain regions of said first and said second field effect transistors. In an exemplary embodiment, the dopant implant layer is a silicide such as tungsten silicide. In one embodiment, the first dopant is boron. In another embodiment, the second dopant is phosphorus. In a preferred embodiment, the silicide is tungsten silicide.

BRIEF DESCRIPTION OF THE DRAWING(S)

FIGS. 1–4 are sectional views of a portion of an integrated circuit fabricated according to this invention.

For reason of clarity, the elements depicted are not drawn to scale.

DETAILED DESCRIPTION

Figure 1:
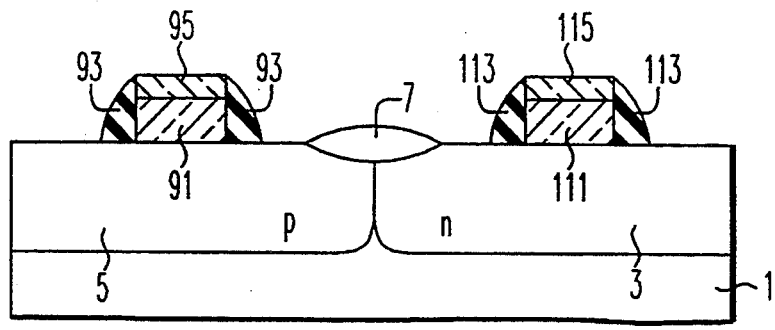

The invention will be described by reference to an exemplary embodiment. FIG. 1 shows substrate 1, n-tub region 3, p-tub region 5, field oxide region 7, and gate structures 9 and 11 in the p- and n-tubs, respectively. The gate structures 9 and 11 have conducting layers 91 and 111, respectively. These conducting layers may be formed from polysilicon. The gate structures 9 and 11 also have dielectric sidewalls 93 and 113 and dielectric top layers 95 and 115, respectively. The gate oxide is not shown for reasons of clarity. The term "substrate" is used to mean any material that lies beneath and supports another layer. The substrate is typically a silicon wafer.

The structure depicted will be readily formed by those skilled in the art and details of fabrication need not be given. See, for example, U.S. Pat. No. 4,435,985 issued on Mar. 13, 1984 to Parillo and Payne for description of an exemplary method of forming the p- and n-tubs. Conventional deposition and lithographic patterning techniques may be used. The dielectrics arc typically silicon oxides.

Figure 2:
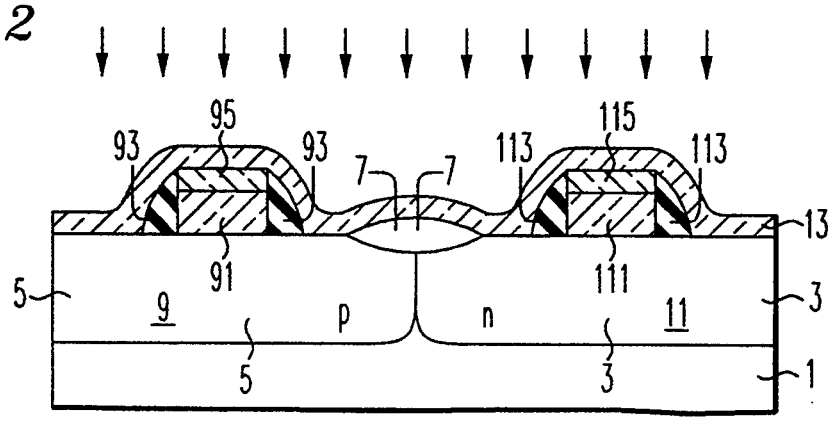

A silicide layer 13 is now formed on the surface of the structure depicted in FIG. 1 and implanted everywhere with boron, that is, a first dopant having a first conductivity type. The structure is shown in FIG. 2 with the ion implant indicated by the arrows. The energy selected is such that the implant does not go through the silicide layer. An exemplary silicide is $WSi_2$. This silicide can be deposited conformally and causes minimal damage to the substrate surface. The layer may be called a dopant implant layer.

Figure 3:
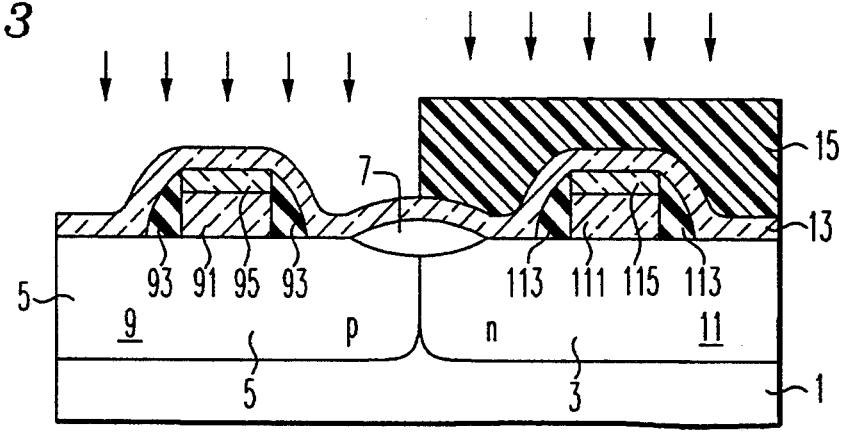
Figure 4:
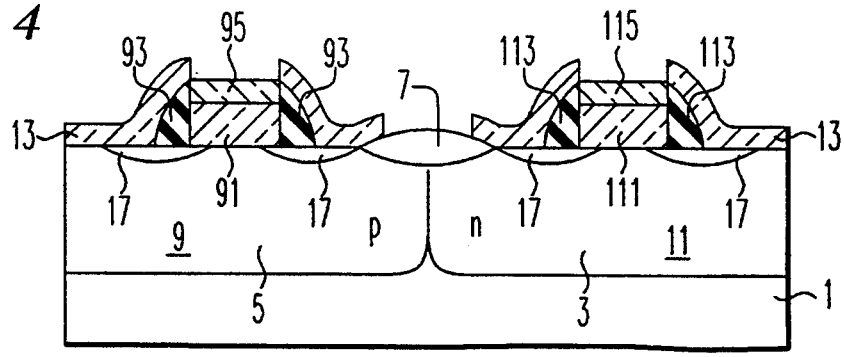

A mask layer 15 is now formed by, for example, patterning a photoresist so that it covers n-tub 3. The structure is shown in FIG. 3. As shown by the arrows, phosphorous, that is, a second dopant having a second conductivity type, is now implanted. However, the n-tub is screened by the patterned resist and the phosphorous is implanted into the silicide over only the p-tub. The energy selected is such that the implant does not go through the silicide layer. The mask layer 15 is now removed. Typical implantation dosages arc $3 \times 10^{15}$ and $5 \times 10^{15}$ for boron and phosphorous, respectively.

After the landing pads have been formed, the structure is heated to a temperature and for a time sufficient to cause sufficient outdiffusion from the silicide layer to form the source/drain regions 17 of the transistors. In the n-channel transistor, the phosphorous outdiffuses but the boron does not. In the p-channel transistor, only boron is present to outdiffuse. Accordingly, it will be appreciated that both n- and p-channel transistors have been formed. The landing pad layer is patterned to form discontinuities over the gate structures 9 and 11 and over the field oxide 7.

It will be appreciated that although both n- and p-channel transistors have been formed by outdiffusion from a silicide layer, only a single mask is required for the fabrication rather than the two required by prior art fabrication processes.

In the embodiment described, the phosphorous is implanted at a heavier dosage, approximately twice, than is the boron. This is believed desirable for the practice of the invention.

Variations in the embodiment described will be readily thought of by those skilled in the an. For example, polysilicon may be used for the dopant implant layer.

We claim:

1. A method of making an integrated circuit comprising at least one n-channel field effect transistor and at least one p-channel transistor comprising the steps of:

forming regions of first and second conductivity types in a substrate;

fabricating gate structures of at least one first and at least one second field effect transistors; at least one of said at least one first and at least one of said at least one second field effect transistors being in said regions of first and second conductivity types, respectively;

forming a dopant implant layer on said regions of first and second conductivity types;

blanket implanting a first dopant having said a first conductivity type in said dopant implant layer on the said regions of first and second conductivity types;

masking said regions of said second conductivity type;

blanket implanting a second dopant having said a second conductivity type in the unmasked portion of the dopant implant layer; and heating the resultant structure to cause said dopants to diffuse from said dopant implant layer and form source/drain regions of said first and said second field effect transistors.

2. A method as recited in claim 1 in which said first dopant is boron.

3. A method as recited in claim 2 in which said second dopant is phosphorous.

4. A method as recited in claim 3 in which said second dopant is implanted with a dosage approximately twice that of said first dopant.

5. A method as recited in claim 1 in which said dopant implant layer comprises a silicide.

6. A method as recited in claim 5 in which said silicide is tungsten silicide.

* * * * *